United States Patent [19]

Edelstein et al.

[11] Patent Number: 4,840,700

[45] Date of Patent: Jun. 20, 1989

[54] CURRENT STREAMLINE METHOD FOR COIL CONSTRUCTION

[75] Inventors: William A. Edelstein; Frederick Schenck, both of Schenectady, N.Y.

[73] Assignee: General Electric Company, Schenectady, N.Y.

[21] Appl. No.: 73,552

[22] Filed: Jul. 13, 1987

Related U.S. Application Data

[63] Continuation of Ser. No. 795,024, Nov. 4, 1985, abandoned, which is a continuation of Ser. No. 548,041, Nov. 2, 1983, abandoned.

[51] Int. Cl.[4] .............. B44C 1/22; H01F 7/06
[52] U.S. Cl. ............................ 156/634; 29/602.1; 29/847; 156/659.1
[58] Field of Search .......... 156/629, 630, 659.1, 156/634, 664, 666, 633, 656, 660, 901, 902; 336/200; 324/200, 321, 307, 309, 318, 319, 320, 324, 322, 328; 29/605, 602 R, 835, 846, 847; 361/146; 335/229; 430/318, 319

[56] References Cited

U.S. PATENT DOCUMENTS

| | | | |
|---|---|---|---|
| 3,376,138 | 4/1968 | Giangualano et al. ............. | 430/318 |
| 3,515,979 | 6/1970 | Golay ................... | 324/319 |
| 3,622,869 | 11/1971 | Golay ................... | 324/320 |
| 3,769,698 | 11/1973 | Lademann et al. ............ | 29/602 R |
| 4,075,591 | 2/1978 | Haas .................... | 336/200 |
| 4,106,187 | 8/1978 | Smith et al. ............... | 29/847 |
| 4,165,479 | 8/1979 | Mansfield ............... | 324/0.5 A |
| 4,302,268 | 11/1981 | Tachiki et al. ............... | 156/238 |
| 4,361,807 | 11/1982 | Burl et al. ................. | 324/309 |
| 4,456,881 | 6/1984 | Compton ................ | 324/319 |
| 4,475,084 | 10/1984 | Moore et al. .............. | 324/309 |
| 4,480,228 | 10/1984 | Bottomley ............... | 324/309 |
| 4,486,711 | 12/1984 | Frese et al. ............... | 324/319 |
| 4,621,236 | 11/1986 | Halbach ................. | 324/319 |
| 4,639,708 | 1/1987 | Weatherly ............... | 336/200 |
| 4,646,024 | 2/1987 | Schenck et al. ............ | 324/307 X |

FOREIGN PATENT DOCUMENTS

| | | |
|---|---|---|
| 0073402 | 8/1982 | European Pat. Off. . |
| 2315498 | 10/1973 | Fed. Rep. of Germany . |
| 2360259 | 6/1974 | Fed. Rep. of Germany . |
| 3135962 | 5/1982 | Fed. Rep. of Germany . |
| 3148192 | 6/1983 | Fed. Rep. of Germany . |
| 1416246 | 12/1975 | United Kingdom . |
| 2083952 | 3/1982 | United Kingdom . |

OTHER PUBLICATIONS

Sutherland, R. J., "Selective Excitation in NMR and Considerations for Its Application in Three-Dimensional Imaging", Thesis, Univ. of Aberdeen, 1980.

*Primary Examiner*—Michael W. Ball
*Assistant Examiner*—Ramon R. Hoch
*Attorney, Agent, or Firm*—Geoffrey H. Krauss; James C. Davis, Jr.; Marvin Snyder

[57] ABSTRACT

Etching methods are employed on a thin conducting sheet so as to fabricate complicated magnetic coil patterns which are necessary to produce magnetic fields of high uniformity or other given design. The etching is performed so that material is removed along a thin line or lines which correspond to current streamlines of the ideal current distribution so that the remaining material exhibits a relatively wide region of conducting material having reduced electrical resistance.

10 Claims, 10 Drawing Sheets

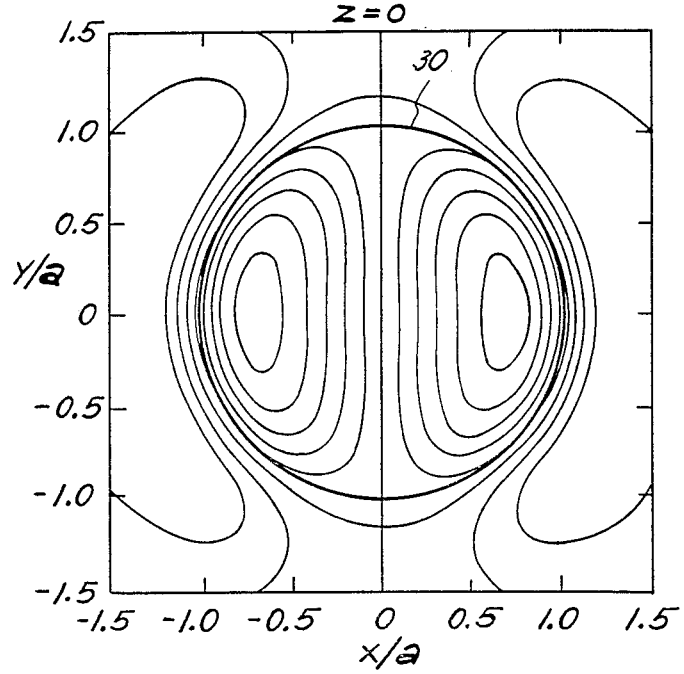
FIG. 5  δ=0.1  RANGE -0.5 to 0.5  z=0
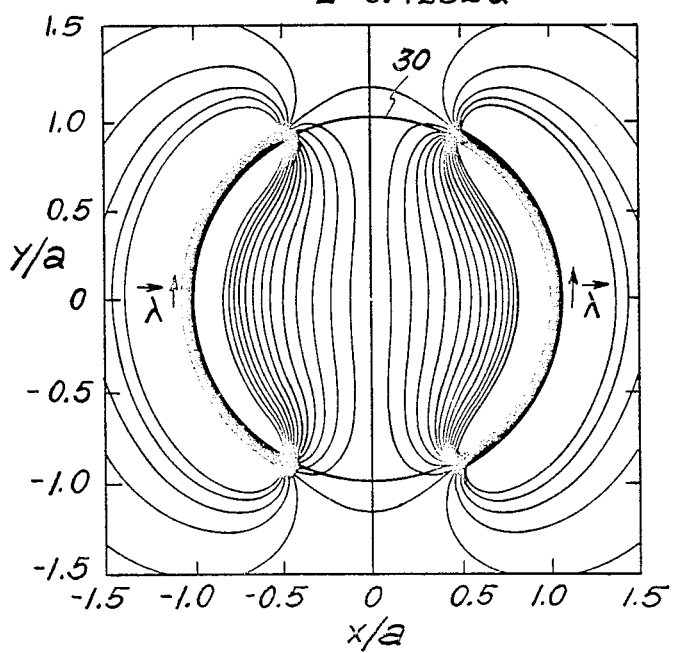
FIG. 6  δ=0.1  RANGE -1.3 TO 1.3  z=0.4292a FIG. 9  LOGARITHMIC ERROR PLOT
X-Z PLANE (y=0.0)
δ=0.5  RANGE -3.0 TO 0.5
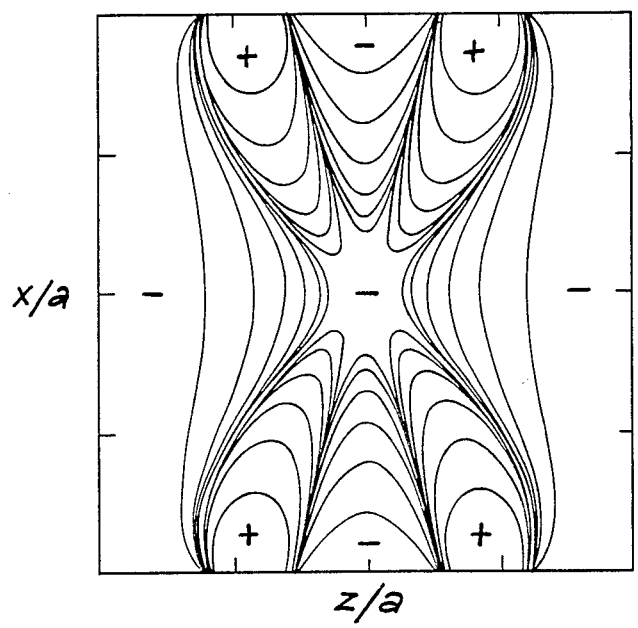
FIG. 10
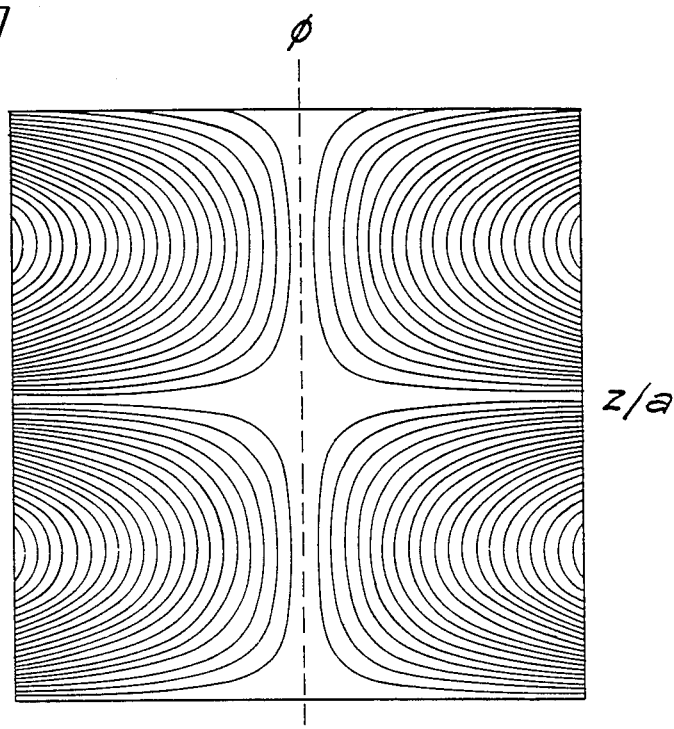

CURRENT STREAMLINE METHOD FOR COIL CONSTRUCTION

This application is a continuation of application Ser. No. 795,024, filed 11/4/84 now abandoned, which is itself a continuation of Ser. No. 548,041 filed 11/2/83 now abandoned.

BACKGROUND OF THE DISCLOSURE

The present invention is generally directed to the manufacture of electrical coils to produce magnetic fields. More particularly, the present invention relates to an etching method for the construction of coils and electrical circuits in general in which currents are continuously distributed on a surface such as a cylinder.

The method described herein is particularly directed to the construction of transverse gradient field coils for use in nuclear magnetic resonance (NMR) whole body imaging systems. However, it should be understood that the discussion herein relating to transverse gradient field coils is merely exemplary. The method of the present invention is equally applicable to the construction of other coils. For example, in the NMR imaging arts, the present invention is equally applicable to the instruction of shim coils. Furthermore the applicability of the present invention is not limited to NMR systems but may be applied in any case in which a continuous current distribution in a surface is employed as part of the circuit design. However, for the purpose of providing a thorough example of the method of the present invention, attention is now directed to the requirements of NMR imaging systems and the use of transverse gradient coils therein.

It has been shown in recent years that the phenomenon of nuclear magnetic resonance may be advantageously employed to construct tomographic medical images of the internal human anatomy. While NMR methods have been employed for many years in the past in the field of chemistry to identify various atomic constituents found in material samples, the application of this technology to imaging is relatively new. At present, its medical and diagnostic applications appear to be numerous and significant. NMR imaging methods also appear to be able to provide physicians, diagnosticians and other medical personnel with heretofore unavailable information concerning various human and animal physiological and metabolic processes particularly those involving phosphorus and the utilization of phosphorus-containing compounds.

For proper operation, the apparatus employed must be able to generate several distinct magnetic fields typically within a cylindrical volume into which the patient or object under study is placed. The present invention is directed to the formation of one of these fields. For example, it is necessary to provide a large but constant magnetic field oriented along the axis of the cylindrical patient volume. Magnetic fields from about 0.04 tesla to as high as 1.5 tesla or more are contemplated as comprising this constant magnetic field. Additionally, superimposed upon the large constant field in the longitudinal, or Z-axis, direction there is a much smaller z-gradient field for the purpose of providing position information in the longitudinal direction, that is in the z-axis direction. To provide position information in a plane perpendicular to the cylindrical axis, two additional magnetic fields are provided. One is called the "x gradient" and provides a field B such that $\partial B_z/\partial x$ is constant. The other is called the "y gradient" and provides a field B such that $\partial B_z/\partial y$ is constant. The x and y directions are perpendicular to one another, as in the conventional Cartesian coordinate system. It is an object of the present to provide winding patterns which are particularly useful for providing such transverse gradient magnetic fields.

Commonly used transverse gradient coil designs for NMR applications are based on designs directed to chemical evaluation of small samples rather than the construction and design of large scale NMR systems for medical diagnosis. For example, in U.S. Pat. No. 3,622,869 issued 1971 to M. J. E. Golay and titled "High Homogeneity Coils for NMR Apparatus," there is described a saddle-type coil structure exhibiting the desired degree of linearity only in a restricted central region of the cylindrical coil form. Similarly, in a paper presented by J. Dadok at the Tenth Annual Experimental NMR Conference in Pittsburgh, Pa. in 1969 titled "Shim Coils for Superconducting Solenoids", similar coils were described. These coils are deficient in that the magnetic fields produced by them do not have the properties desired for medical diagnostic applications.

Although they are satisfactory for samples that are small compared to the cylindrical form on which the coils are wound, they are not useful if the sample is large enough to approach the walls of the cylindrical coil form. This is the situation in NMR imaging. A particular drawback of such coils in the presence of a point at which the field actually departs so far from linearity that it reverses itself. This leads to the undesirable feature of aliasing which occurs wherever the object to be imaged extends beyond this point. To illustrate the undesirability of such effects in a medical imaging situation, aliasing would for example, cause part of the image of a liver section to be superimposed upon the image of, say, a kidney, thereby obscuring valuable data. Another undesirable feature of previously employed transverse gradient coils is that they tend to concentrate the electric current into localized regions. This increases the inductance of the coils and reduces their ability to produce rapidly changing magnetic field gradients. It has been seen then that for NMR imaging purposes, coil inductance and resistance should be kept as low as possible.

Another transverse gradient coil design has been presented in a doctoral thesis submitted by Robert John Sutherland in which there is described a coil set designed around the assumption of an infinitely long cylinder. The design presented falls short in that satisfactory current return paths are not provided, either in fact or within the framework of the mathematical model employed.

Accordingly, it is seen that there is a need for a transverse gradient coil designed based on distributed currents so as to lower the inductance and which is capable of producing transverse gradient fields of high linearity and which is practically sized for easy construction.

SUMMARY OF THE INVENTION

In accordance with a preferred embodiment of the present invention, a method for producing electrical circuits in which currents are specified as being continuously distributed on a surface, such as a cylinder, comprises determining the current streamlines corresponding to said specified current distribution and then removing a thin line of conductive material from a conductive layer mounted on an insulating substrate, wherein this thin line corresponds to a current streamline.

In accordance with one particular embodiment of the present invention, a transverse gradient coil comprises a cylindrical coil form, and four winding loop sets disposed in both azimuthal and axial directions. Each of the loop sets is configured to produce a specified surface current density $\lambda(\phi,z)$. Here z is a measure of the axial position on the coil form and $\phi$ is the azimuthal angle. The current density $\lambda(\phi,z)$ is a vector quantity and has specified angular component $\lambda_\phi(\phi,z)$ and a longitudinal component $\lambda_z(\phi,z)$. (In particular, $\lambda_\phi(\phi,z)$ and $\lambda_z(\phi,z)$ are best illustrated in FIG. 12, which is described and discussed below.) Components of the current density are often described herein in terms of nondimensional shape functions $\sigma_\phi(\phi,z)$ and $\sigma_z(\phi,z)$. These functions are obtained from $\lambda_\phi(\phi,z)$ and $\lambda_z(\phi,z)$ by dividing the total number of ampere-turns in the coil.

In a further embodiment of the present invention, a second set of four winding loop sets having the same configuration as the first set is disposed on the same coil form but oriented at right angles with respect to the first set. Such a pair of transverse gradient coil sets provides both x and y gradient fields for spatial discrimination.

The transverse gradient coils manufactured in accordance with the method of the present invention may be conveniently fabricated on flexible insulated circuit boards and wrapped around the cylinder in the appropriate positions and orientations. In order to implement manufacture of one of these etched coils, a computer controlled drawing of a current streamline is prepared on a transparent substrate. A second substrate is then prepared which is the negative (in the photographic sense) of the first drawing. When the second sheet is used as a mask to etch the coil, the thin line corresponding to the original current streamline is etched away. The remaining material then forms a coil with low resistance.

Accordingly, it is an object of the present invention to provide a method for the manufacture of electric circuits and especially coils in which the magnetic fields produced by the coils are accurately determined in accordance with specified continuous surface current distributions.

It is also an object of the present invention to provide transverse gradient and other coils for NMR imaging systems.

It is also an object of the present invention to provide a method for the manufacture of transverse gradient NMR imaging coils.

It is additionally an object of the present invention to provide transverse gradient coils exhibiting high levels of field linearity so as to eliminate the production of undesired image artifacts, particularly artifacts due to aliasing effects.

Lastly, it is an object of the present invention to provide a current distribution on a cylindrical surface that provides a highly uniform, linearly varying transverse gradient field.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 5 is a plot of contour lines for $B_z$, the z component of the net magnetic field, the plot being drawn for the central transverse plane, z=0;

FIG. 6 is a plot similar to that shown in FIG. 5 except shown here for the transverse plane $z/a = 0.4292$, where a is the radius of the cylinder;

FIG. 9 is a logarithmic error plot similar to FIG. 8 except shown for the plane, y=0;

FIG. 10 is the planar representation of coil winding patterns in accordance with the present invention which provide the surface current density which is required to produce the desired transverse gradient field, illustrating an idealized situation in which the current paths are extended indefinitely along the cylindrical axis;

DETAILED DESCRIPTION OF THE INVENTION

Figure 1:
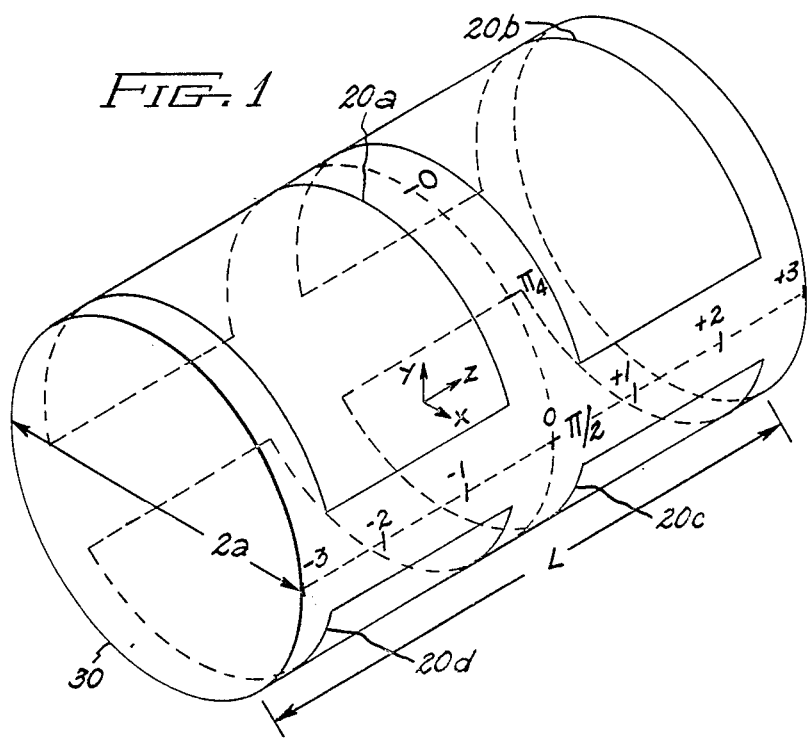
FIG. 1 is an isometric view illustrating conventional transverse gradient saddle coils mounted on a cylindrical coil form.

FIG. 1 illustrates, in a general fashion, the configuration conventionally employed in the construction of transverse gradient field coils in NMR imaging systems. In particular, the coil winding pattern shown in FIG. 1 is configured to produce a magnetic field having a component along the axial direction of cylindrical form 30, such that the magnetic field component in this direction, $B_z$, exhibits a uniformly linear variation in a direction perpendicular to the cylindrical axis. In the coil orientation shown, a gradient magnetic field is produced such that there is a linear variation in the field measured in a direction substantially perpendicular both to the diameter line shown designating the diameter of coil as being 2a and to the longitudinal axis. Thus, the radius of the coil form being considered herein is denoted by a. The length of the coil form is denoted by L. The radius a and length L are important parameters in understanding the discussions below concerning the present invention since distance along the cylinder or along the z-axis is typically measured herein as a multiple of the cylinder radius a. The coil patterns shown in FIG. 1 produce a field that only approximates the desired degree of linearity in the magnetic field.

Nonetheless, an appreciation of the overall winding pattern shown in FIG. 1 provides helpful insights into the construction and advantages of the present invention. For example, it is seen that the transverse gradient coils are disposed in a saddle shape form, each separate coil 20a, 20b, 20c and 20d being wrapped partially around coil form 30. It is also seen that there are four such coils employed and that they are disposed so as to exhibit symmetry in three ways. First, the coils are disposed symmetrically with respect to the cylinder or z-axis. Second, the coils exhibit mirror image symmetry with respect to a plane perpendicular to the x-axis. Third, because the coils shown illustrate the configuration provided to generate a gradient in the y-axis direction, there is also a mirror image symmetry with respect to a plane perpendicular to the y-axis, namely the x-z plane. Accordingly, the coils generally employed to produce transverse gradient magnetic fields are disposed in four different quadrants in a highly symmetric arrangement, such as that shown in FIG. 1.

Figure 2:
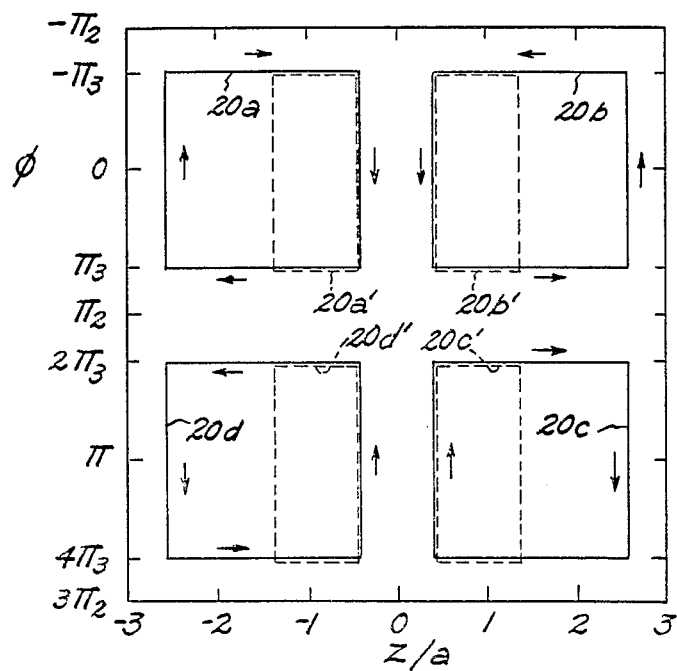
FIG. 2 is a planar representation of the coils shown in FIG. 1 together with an indication of alternative coil placement patterns.

Because the surface of a cylinder is isometric to the plane, and since it is generally more convenient to depict planar images, the construction of coils in accordance with the present invention is described herein in accordance with the patterns exhibited by specially designed coils when they are disposed in a planar configuration, prior to wrapping them onto a cylindrical coil form or mandrel. With this in mind, attention is directed to FIG. 2 in which the four coils of FIG. 1 are shown in an unrolled, planar pattern. In particular, FIG. 2 also indicates the desired direction of current flow within the four coils. Of course, the current directions in all four of these coils could be reversed, without deleteriously affecting the operation of the present invention. Additionally, shown in FIG. 2 is an alternate winding pattern illustrated by coils 20a', 20b', 20c', 20d' shown as dotted lines in the figure. Along the lower horizontal axis there is illustrated a scale measured in units relative to the radius, a, of the coil. Distances and positions in a circumferential direction on the coil form in FIG. 1 are more particularly shown in a linear fashion on the left-hand vertical axis of FIG. 2 which represents position along the circumference of coil form 30 as measured in radians, starting from the zero (top) position shown in FIG. 1, with an arc length of one-fourth of the circumference being designated by the angle $\pi/2$, there being $2\pi$ radians in the entire circumference. Accordingly, planar illustrations such as FIG. 2 are employed herein to more easily depict the coil winding patterns for transverse gradient field coils. In particular,
it is seen that the rectangular description of the coils in FIG. 2 is much more readily appreciable than the curved patterns shown in FIG. 1, even though FIG. 1 more accurately depicts the physical embodiment. Nonetheless, for ease of understanding and illustration, the coil winding patterns of the present invention are typically shown in the present figures disposed in the planar configuration, it being understood that, in practice, these coils are wrapped around or formed directly on coil form 30. Notwithstanding this however, it should also be appreciated that there utility in disposing the coils of the present invention on flexible printed circuit board material and then wrapping the flexible printed circuit around a cylinder of appropriate diameter. Additionally, it is also possible to form the winding patterns of the present invention directly on an appropriate coil form.

While FIG. 2 illustrates a single loop for each of the four coils 20a, 20b, 20c, and 20d, it is generally understood that multiple turn coils are typically employed, the number of turns and the current being selected to provide the desired field strength. In discussing the field strength with respect to the present invention, it is understood that the magnetic field of interest is the z component of magnetic field, $B_z$, that is the magnetic field in the direction of the cylinder axis. In general, this field is dependent upon the position within the cylindrical volume. Nonetheless the field $B_z$ does contain a large constant component $B_o$ which typically arises from a superconducting magnet, a resistive magnet, or a permanent magnet. In NMR imaging systems, $B_o$ is typically between about 0.04 and 2.0 Tesla, or more. However, it should also be appreciated that the coil of the present invention is applicable in any system in which a transverse gradient is desired.

Figure 3:
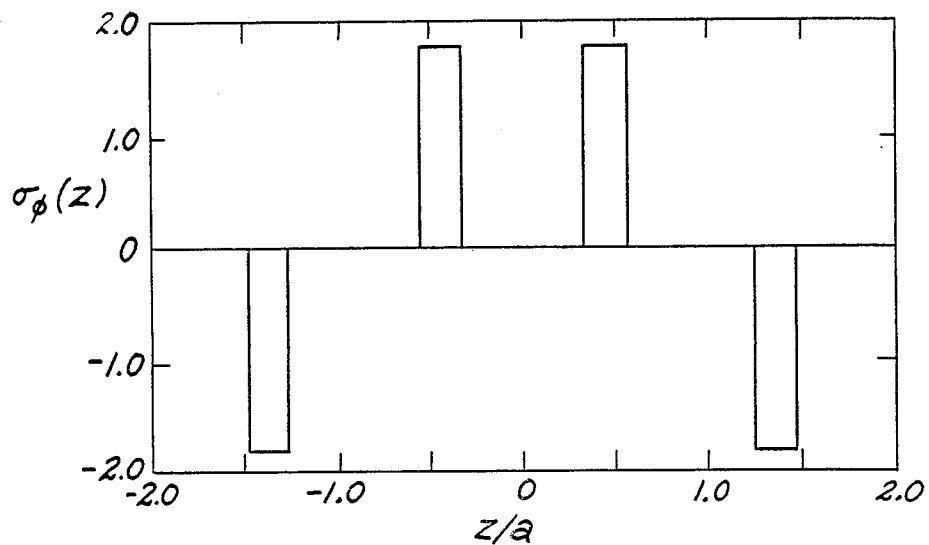
FIG. 3 is a graph of surface current density distribution in an axial direction as a function of normalized position along the cylindrical axis.

From the winding pattern shown in FIGS. 1 and 2 it is seen that the currents flowing horizontally in FIG. 2, that is, parallel to the cylinder axis in FIG. 1, contribute nothing to the z component of the magnetic field within the cylinder volume. The contributions to the magnetic field in this direction are provided by the currents indicated by the vertical arrows of FIG. 2, that is, by the currents traversing the arcuate portions of the windings shown in FIG. 1. Accordingly, it is seen that the current in these conductors determines the nature of the z component of the magnetic field for the windings shown in FIGS. 1 and 2. However, the z component of the magnetic field produced by the windings of FIGS. 1 and 2 suffers from several problems related to nonlinearity and aliasing. Moreover, an appreciation of the description of the winding patterns of FIG. 2 in terms of surface current density distribution is extremely useful for an understanding of the present invention which is more particularly described below in terms of surface current distribution necessary to produce the desired linear gradient field. For example, if one were to consider the line $\phi = \pi$ in FIG. 2 and consider the current density crossing this line as a function of longitudinal position as measured by the normalized coordinate z/a, one would obtain the curve shown in FIG. 3. FIG. 3 is a plot of the circumferential or $\phi$ component of the current density as a function of longitudinal position. Thus, FIG. 3 shows four concentrations of current density corresponding to the four current arrows traversed by the line $\phi = \pi$. Each of the current density concentrations shown in FIG. 3 has a finite width to reflect the fact that the coils shown generally comprise a plurality of turns disposed in a pattern having a finite width.

It has been found that a convenient method of characterizing the field $B_z$ is by expanding the field (in the mathematical sense) in terms of solid spherical harmonics. Because of the symmetry of the apparatus being considered, various simplifications in the expansion can be made so that $B_z$ an be written as:

$$B_z = \frac{\mu_0 c}{4\pi} \frac{\sqrt{3}}{2} \sum_{n=1}^{\infty} \sum_{m=1}^{n} a_m \gamma_m \left(\frac{x}{a}\right)^n P_n^m(\theta)$$

In particular, the above equation shows the variation of $B_z$ as a function of the position x measured in the transverse direction, that is perpendicular to the longitudinal cylindrical axis z. In general, x varies between $-a$ and $+a$. $B_z$ may also be expanded in a conventional Taylor series expansion as follows:

$$B_z = \frac{\mu_0 c}{\pi} \frac{\sqrt{3}}{2} \sum_{n=2}^{\infty} c_n \left(\frac{x}{a}\right)^n$$

Figure 4:
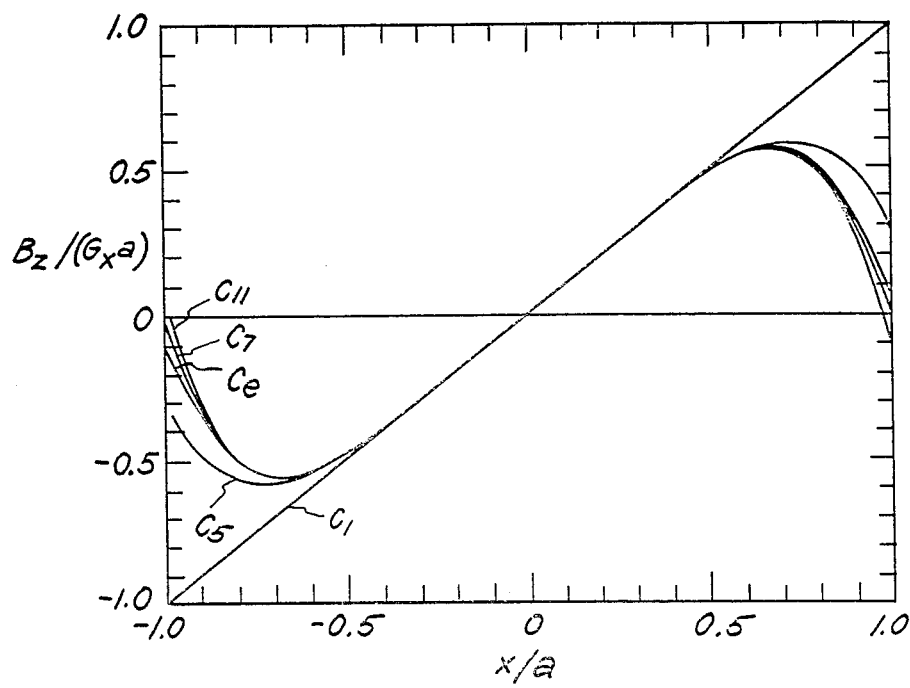
FIG. 4 comprises several graphs which approximate the variation of the z component of the magnetic field produced by the coils shown in FIG. 1.

The results of such a Taylor series expansion are shown in FIG. 4 for the winding patterns of FIGS. 1 and 2. In particular, FIG. 4 is a normalized plot of the z component of magnetic field $B_z$ as a function of the normalized transverse coordinate x/a. Additionally, the ordinate of the graph in FIG. 4 has also been normalized by the factor $G_x a$, where $G_x$ is the gradient of the $B_z$ field in the x direction, that is, $G_x = \partial B_z / \partial x$. There are several curves shown in FIG. 4 each illustrating the resultant curve for the inclusion of higher and higher powers of the transverse variable (x/a). For example, curve $C_{11}$ illustrates the result under the Taylor series expansion including the terms $X$, $X^3$, $X^5$, $X^7$, $X^9$, and $X^{11}$. The curve $C_e$ represents the exact result if all of the terms in the Taylor expansion are employed. These results have confirmed the accuracy of the methods of analysis employed herein.

More importantly, however, the curves of FIG. 4 illustrate the problems that result from conventionally employed winding patterns of FIGS. 1 and 2. In the ideal situation the curve $C_1$ is the desired gradient field in the transverse x direction. In short, as one moves in a transverse direction from one wall of the cylinder through the cylinder axis to the other wall, it is desired that $B_z$ (the magnitude of the z component of the magnetic field within the cylinder) exhibit a linearly increasing variation. The greater the deviation from linearity the less useful the gradient field is for providing the desired levels of spatial resolution required for NMR imaging applications. If the coils of FIGS. 1 and 2 produced a gradient field characterized solely by the curve $C_1$ then these patterns would be the most desirable ones to use. However, they do not and are not. In particular, they actually result in the curve $C_e$ which is seen to be not only highly nonlinear but is also actually seen to reverse direction when x is approximately equal to $0.7a$. This is an exceedingly undesirable effect that leads to aliasing, that is, the reconstruction phenomenon in which objects lying adjacent to the walls of the cylinder are reproduced in the image in a more central location, overlying body structures which are already present at the central location. From a practical NMR imaging point of view, this aliasing effect could typically mean that the image of a liver is shown overlying the image of a kidney. Obviously such effects are to be avoided for a proper medical understanding of the image produced.

In sum then, it is seen that FIG. 4 shows not only the ideal gradient curve desired, namely the curve $C_1$, but also illustrates the actual resulting gradient curve produced by coils of FIGS. 1 and 2, namely the curve $C_e$. Because of the non-linearity of curve $C_e$ and because it reverses directions beyond $x = 0.7a$, it is seen that the coils of FIGS. 1 and 2 severely limit the size of the object which can be imaged. This is unacceptable for whole body imaging.

Figure 7:
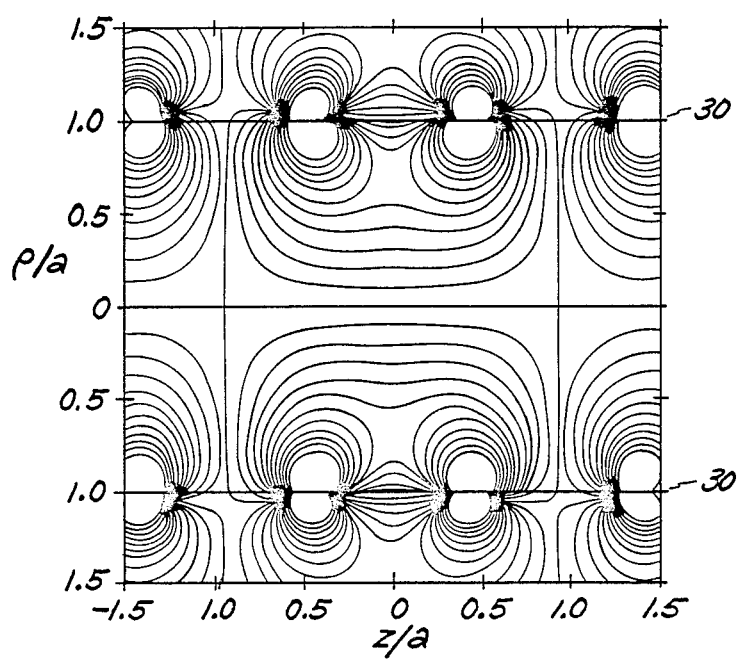
FIG. 7 is a plot of the contour lines for $B_z$ for the plane y=0.

A further understanding of the problems associated with the gradient coils of FIGS. 1 and 2 can be appreciated from consideration of FIGS. 5 and 6. FIGS. 5 and 6 both illustrate contours of equal levels of strength for field $B_z$. Additionally, FIGS. 5 and 6 illustrate these contours for transverse planes intersecting the z axis. As in the figures above, the ordinate and abscissa axes have been normalized with respect to the radius, a, of the coil form being employed. In particular, FIG. 5 illustrates the contours of $B_z$ for the plane $z_\phi = 0$. The gradient field shown is a gradient in the x direction. FIG. 5 is particularly illustrative of the aliasing effect that can occur around $x/a = 0.7$. However, the central field for $B_z$ does nonetheless exhibit relatively good linearity. Unfortunately, the extent of the region of linearity is limited. FIG. 6 is a view very much similar to FIG. 5 except that the contour plots for $B_z$ are taken through the plane $z_\phi/a32\ 0.4292$. This transverse plane corresponds to the location of the inner current arcs in FIG. 1. It is seen that in this particular transverse plane the aliasing problem is significantly reduced but that the linearity is much less than ideal. For the sake of comparison, FIGS. 5 and 6 ma be compared with FIGS. 13 and 15 which illustrate the contours for $B_z$ that are obtained with the coil structure of the present invention. Further comparison may also be had through consideration of FIG. 7 which likewise illustrates contour lines for equal magnitudes of $B_z$. However, FIG. 7 is different from both FIGS. 5 and 6 in that it is plotted as a function of distance along the transverse axis and circumferential position, as illustrated by the variables z/a and $\rho/a$ (not $\phi$ as in FIG. 2) which are employed as the abscissa and ordinate respectively. The two horizontal lines denoted by reference numeral 30 in FIG. 7 denote the location of coil form 30.

Figure 8:
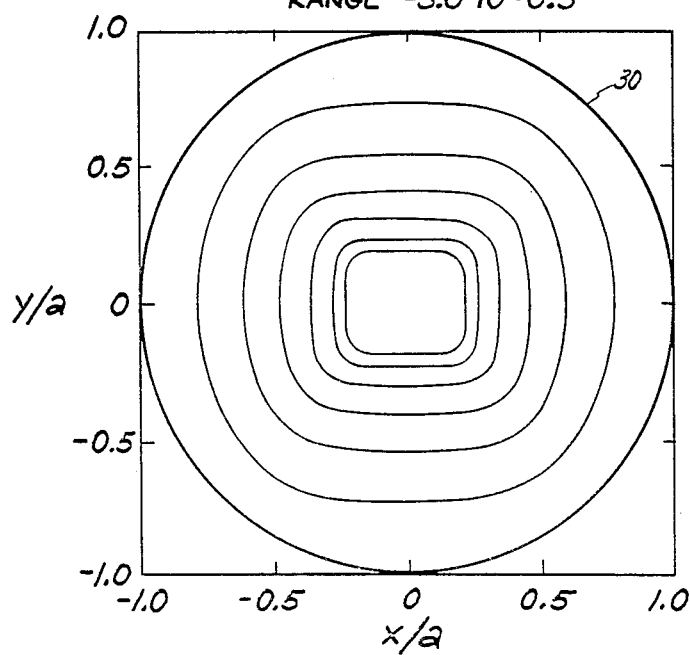
FIG. 8 is a logarithmic error plot through the central plane $z_0 = 0$ indicating contours of equal error within the cylindrical coil volume for conventionally designed transverse gradient coils.

Because of the imperfect $B_z$ contours provided by the saddle coils of FIGS. 1 and 2, there exist differences between the actual field produced and the ideal field that is desired. FIGS. 8 and 9 illustrate logarithmic error plots showing these deviations from the ideal. Both FIGS. 8 and 9 illustrate contours of equal error size, as measured by percentage, and plotted on a logarithmic scale. The plots shown in FIGS. 8 and 9 have been constructed using the absolute values of the error themselves. Accordingly, the aliasing effect does not manifest itself in the same manner for the plots of FIGS. 8 and 9. Nonetheless, it is clearly seen that as one moves away from the longitudinal axis, there is a significant deviation from the ideal field, which deviation increases as one considers regions farther and farther removed from the z axis. FIG. 8 is a logarithmic error plot for the central transverse plane $z_\phi = 0$. FIG. 9 is a logarithmic arrow plot similar to FIG. 8 except that the equal error contours shown in FIG. 9 are for the longitudinal x-z plane, that is the plane along which $y = 0$. While the contours shown are for absolute values of the percentage deviation from the ideal, nonetheless, plus and minus signs are employed in FIG. 9 to illustrate the direction of deviation within different regions of the plane. Again as above, it is seen that the deviation from the ideal increases with distance from the z axis.

Throughout FIGS. 5, 6, 7, 8 and 9 captions have been employed indicating a number $\partial$ which represents the spacing and contour value employed for the various plots shown. Likewise, ranges have been specified indicating (relatively) upper and lower values for the values of $B_z$ and the error quantities plotted. These numbers have been employed as part of a computer program which was used to plot the graphs shown. They are useful herein in comprehending the relative error sizes that can occur with the coils of FIGS. 1 and 2. It should be further emphasized herein that FIGS. 1-9 have been provided herein for two purposes. First, FIGS. 1-9 have been provided to illustrate the problems associated with conventional, more simplistic saddle coil structures used to produce transverse gradient fields. Second, the graphs of FIGS. 1-9, and in particular, FIGS. 1-4, provide an introductory structure which is relatively easy to comprehend and renders the invention disclosed herein more readily understandable. As is suggested by FIG. 3, the coil structure of FIGS. 1 and 2 is relatively simplistic in that there is only provided a current density distribution which varies with longitudinal position along the z-axis. There is no variation of the current density distribution as a function of circumferential position, that is, at least with respect to the formation of the $B_z$ field which is the field of interest herein. Currents flowing in the longitudinally oriented coil segments of FIG. 1 do not produce magnetic field components in the z direction. A simple application of the so-called right-hand rule from elementary physics verifies that this is indeed the situation. Accordingly, the current density distribution contributing to $B_z$ in FIG. 1-9 is not a function of angular position. This fact accounts for, at least in part, the relatively simple structure shown in FIG. 1. However, in the present invention the surface current density distribution depends on both longitudinal and circumferential coordinates so as to provide the desired degree of linearity and uniformity in the $B_z$ gradient field.

Up until now, FIGS. 1-9 have been employed to illustrate the use of a saddle coil structure to produce the desired transverse gradient field. However, a surface current distribution pattern in accordance with the present invention is now considered. In particular, such a pattern is shown in FIG. 10. Preferably this pattern, or, as is discussed below, its negative, is disposed on a flexible printed circuit substrate in a pattern similar to that shown in FIG. 10. FIG. 10 illustrates the fact that four different coil sets are employed, much the same as is shown in FIG. 2. However, what is not shown in FIG. 10 are current return paths. Thus, FIG. 10 represents part of an ideal form of current path distribution. Because of the curved nature of the current paths shown, it will be readily appreciated that the circumferential component of the surface current density distribution also has a component contributing to $B_z$, the component also now being a function of the circumferential position, which is characterized by the variable $\phi$. It is also apparent in FIG. 10 that there exists a high degree of symmetry in the positioning of the coils. When these coils are wrapped around coil form 30, it is seen that there is mirror symmetry not only across the $z_\phi=0$ plane, but also with respect to the x-z plane. As a consequence of this symmetry condition, it is only necessary to describe one of the set of four current distribution patterns shown in FIG. 10. The other patterns are arranged symmetrically as discussed above. In particular, the pattern in the upper lefthand quadrant of FIG. 10 is considered. It is seen that the winding pattern comprises a sequence of approximately semi-circular arcs of increasing radii arranged in a concentric-like fashion and positioned so that the diameter portions of the arcs lie on the edge of the pattern as shown. It is further seen that with increasing radii, the current distribution patterns increasingly assume the shape of the rectangular quadrant in which they are disposed. Constructing the winding patterns in this fashion results in improved transverse gradient field linearity and significantly mitigates the aliasing problem. However, while the above description is sufficient for practice of the present invention, the preferable construction pattern is based upon the current density distributions given in FIG. 12 which is more particularly described below. Nonetheless, the specific patterns shown in FIG. 10 are the preferred embodiments for the current density distribution that provides the desired transverse gradient field.

In order to provide current flow in the winding patterns of FIG. 10, it is necessary to drive each of the windings with the desired current level. In particular, in the present invention, the same current is supplied to each of the winding loops shown in FIG. 10. The complicated nature of the field equations does not suggest on its face, though, that loops of equal current levels could be employed.

Figure 11:
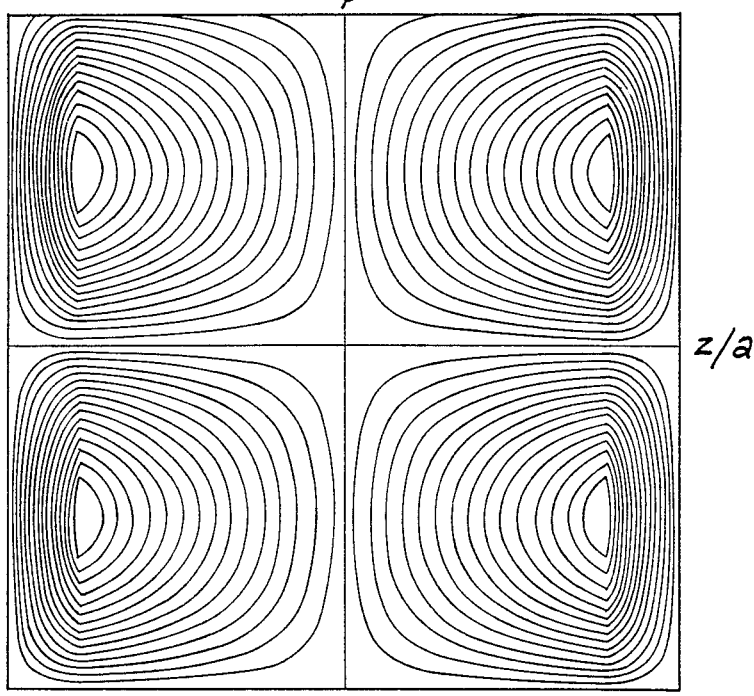
FIG. 11 is similar to FIG. 10 and more particularly includes the return paths of the present invention for the current loops shown in FIG. 10.
Figure 17:
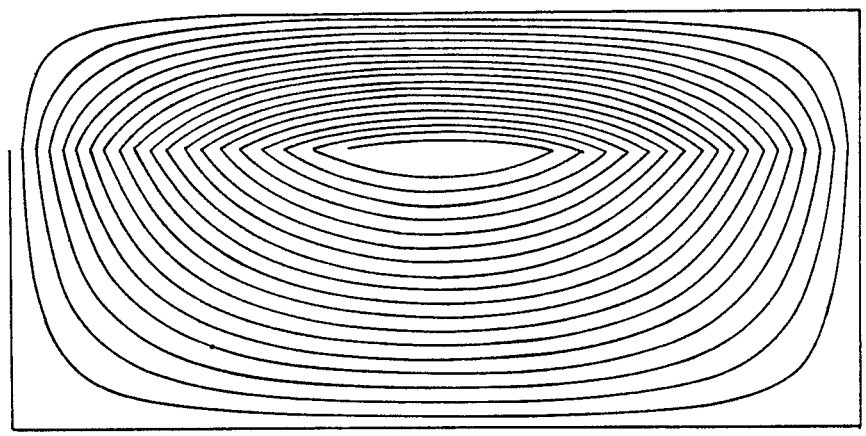
FIG. 17 is a planar representation of a spirally configured embodiment of one of the coils of the set of four shown in FIG. 11.
Figure 18:
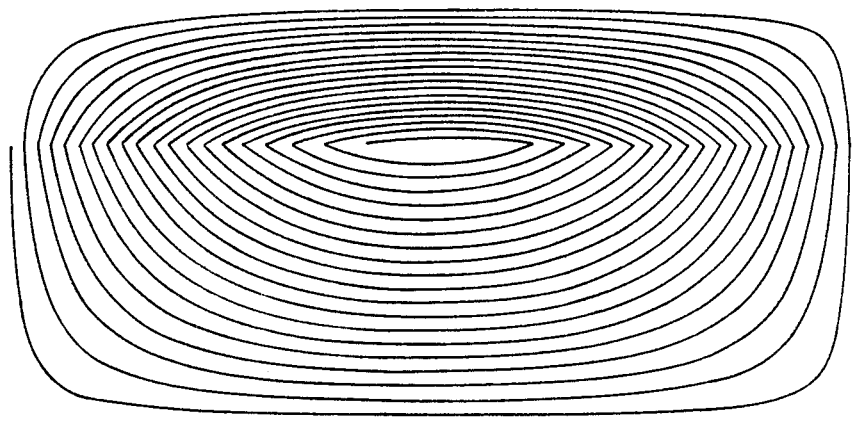
FIG. 18 is similar to FIG. 17 but showing a slightly modified pattern.

However, because it is necessary to connect these wire loops to a current source which itself produces magnetic fields, it is necessary to provide return current paths in such a way as to produce a minimal disruption of the linearity and uniformity of the current distribution created by the pattern of the coils in FIG. 10. Accordingly, FIG. 11 illustrates a set of current return paths for each loop which may be employed to effectively minimize disturbances in the desired field as a result of the necessity of connecting each of the coil loops to a current source. Accordingly, the coils of FIG. 11 illustrate practical implementation of the present invention. However, more practical patterns are illustrated in FIG. 17 and 18 which are discussed below.

While the current distribution paths of the present invention have been described approximately above, it is nonetheless preferred in the present invention to provide current paths which are described precisely in terms of a pair of surface current density distribution functions each of which has longitudinal position along the z-axis as its independent variable. In particular, it can be shown mathematically that the coil patterns shown in FIG. 10 are those that result when the circumferential component of the current density distribution $\sigma_\phi(z)$ (where $\lambda_\phi(z)=ca(\cos\phi)\,\sigma_\phi(z)$) varies with longitudinal position in the manner shown in FIG. 12, and when the longitudinal component of the surface current density distribution $\sigma_z(z)$ (where $\lambda_z(z)=cz(\sin\phi)\sigma_z(z)$) varies with the longitudinal position in the manner illustrated by the heavy dashed curve shown in FIG. 12. Thus, the surface current density distributions as specified in FIG. 12 completely determine the winding patterns that one employs in a preferred embodiment of the present invention. In particular, the curves shown in FIG. 12 ar determinative of the winding patterns that result and which are illustrated in FIG. 11 in which the current return paths are included. The function $\sigma_z(z)$ is characterized as three curve portions A, B and C, each being a straight line on the plot as shown. For the intervals $a \leq z \leq b$, $\sigma_z(z)$ has the form $M_1z+b_1$ where $M_1$ is a slope which may be computed from FIG. 12. Likewise, $b_1$ is a vertical axis intersection value and the equation for curve 4 is expressed in the well known slope-intercept form. Similarly, in the interval $b \leq z \leq c$, $\sigma_z(z)$ is given by $M_2z+b_2$ (curve B) and, in the interval $b \leq z \leq c$, $\sigma_z(z)$ is given by $-Mz+b_3$ (curve C). Usable values for $M_1$, $M_2$, $b_1$, $b_2$, $b_3$, a, b, c and d may be easily read from the curves of FIG. 12. For values of $z < a$ or $z > d$, $\sigma_z(z) = 0$. Note that the symbol a is employed with two distinct, but contextually identifiable, meanings in FIG. 12. In a similar manner, the function $\sigma_\phi(z)$ is characterized by three distinct curve portions, D, E and F, corresponding to the same intervals over which $\sigma_z(z)$ is defined. For $a \leq z \leq b$, $\sigma_\phi(z) = -K_1$; for $b \leq z \leq c$, $\sigma_\phi(z) = +K_2$; and for $c \leq z \leq d$, $\sigma_\phi = -K_1$, otherwise $\sigma_\phi(z) = 0$. Additionally, charge conservation requires certain areas in FIG. 12 to be the same. In particular, the net current flow must be zero so that:

$$\int_a^b \sigma_\phi(z)dz + \int_c^d \sigma_\phi(z)dz = \int_b^c \sigma_\phi(z)dz$$

Figure 12:
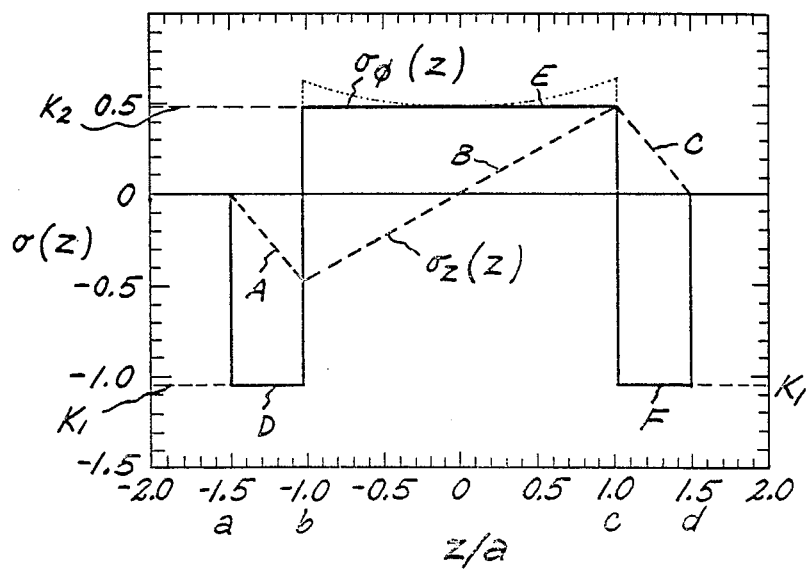
FIG. 12 is a plot of the two components of the surface current density, $\sigma_\phi$ and $\sigma_z$ as a function of longitudinal position on the cylinder.

It should be noted, though, that it is the form of the curves in FIG. 12 which are important in creating the desired form for $B_z$, rather than the specific parameters describing the curves. It is also noted that, as indicated by the lightly dotted line, coils with even higher linearity may also be designed if desired in which the middle section of the $\sigma_\phi(z)$ curve has upturned end regions as shown.

Figure 13:
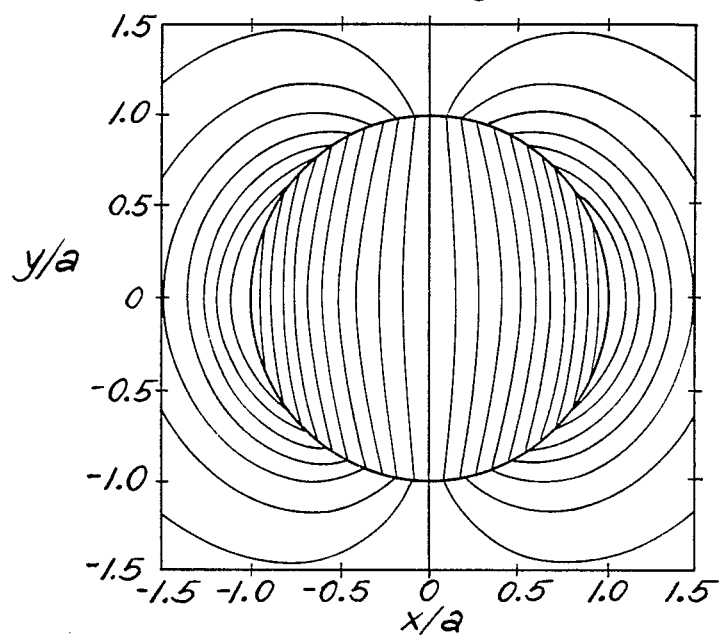
FIG. 13 is a contour plot similar to FIG. 5 except here showing the contours for $B_z$ for the coil of the present invention for the plane perpendicular to the cylinder axis at $z_0 = 0.5$.
Figure 14:
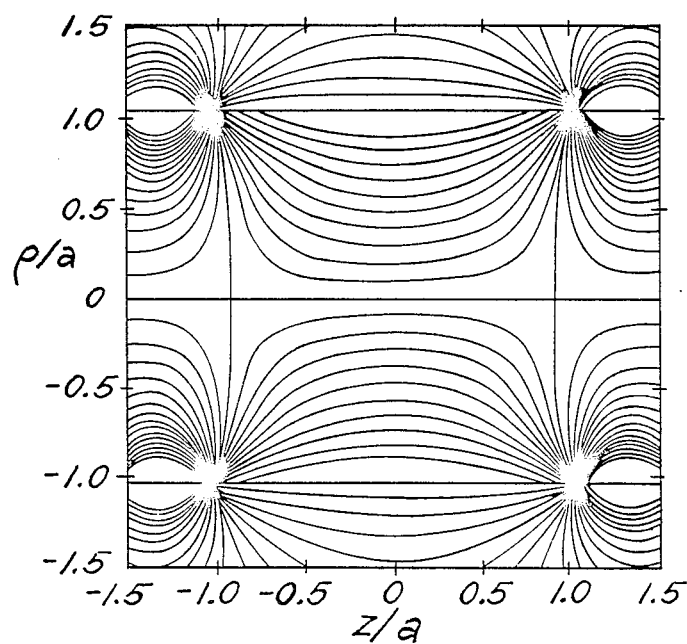
FIG. 14 is similar to FIG. 13 except that the contours are shown in the plane y=0.
Figure 15:
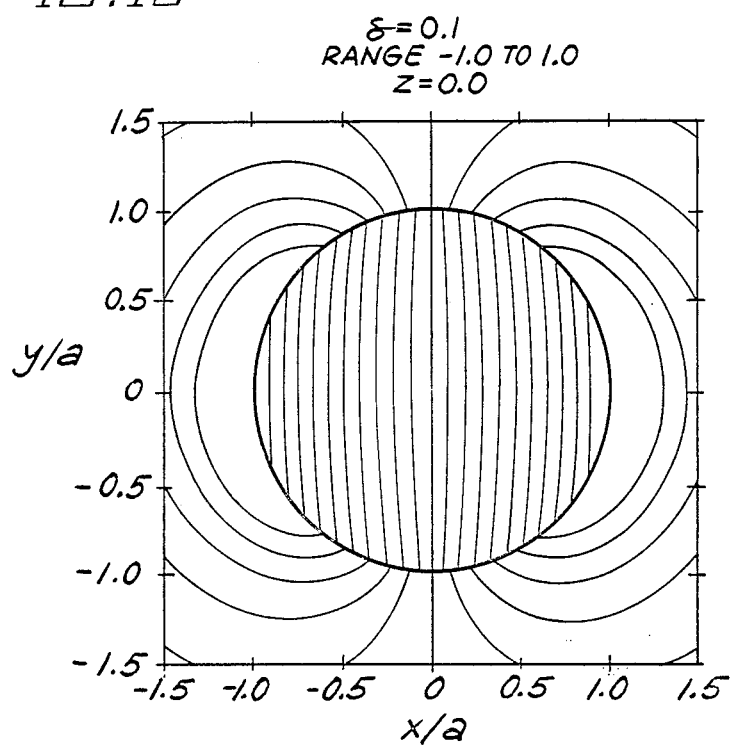
FIG. 15 is similar to FIG. 13 except that it illustrates the contours for the plane $z_0 = 0$.

The advantages of employing winding patterns such as those illustrated in FIGS. 10 and 11 are clearly evidenced in the contour lines for $B_z$ shown in FIGS. 13, 14 and 15. The views shown in FIGS. 13 and 15 are similar, the only difference being that the view in FIG. 15 depicts contour lines lying in the transverse plane defined by $z=0$. This plane is the central plane which (mathematically) bisects coil form 30 into two equal parts. On the other hand, FIG. 13 depicts contour lines for $B_z$ lying in the plane defined by $z=0.5$. The position of this latter plane is perhaps more easily visualized from FIG. 14, in which the plane illustrated in FIG. 13 lies at right angles to FIG. 14 so as to be perpendicular to the walls of form 30 and to the longitudinal cylindrical axis and further passing through the point $z/a=0.5$. It is accordingly seen that the volume bounded by the cylinder walls and the planes $z/a=-0.5$ $z/a=+0.5$ has contained therein a magnetic field whose component in the z direction varies in a highly linear fashion in a transverse direction. This is further illustrated in FIG. 14 in which contour lines for $B_z$ are shown for the transverse plane $y=0$. This plane passes through cylinder walls 30 and contains the longitudinal cylindrical axis. The orientation of the plane $y=0$ might best be appreciated by considering the locations of the lines indicating cylinder walls 30 in FIG. 14. FIG. 14 should be compared with FIG. 7 to further appreciate the improvement in the linearity of $B_z$. In particular, it is seen that the distortions of the $B_z$ field which give rise to aliasing effects are no longer present.

The discussion so far has been principally directed to the proper formation of a set of four winding patterns for a single set of transverse gradient coils. As shown in FIG. 1, a set of transverse gradient coils for producing a gradient in the y-direction comprises a set of four coils. However, for general operation of NMR imaging devices, two such sets of transverse gradient coils are generally required. In particular, in most NMR imaging systems, these coils are oriented so as to produce the desired gradient in an x-direction and a second desired gradient in the y-direction. Together these two gradient fields define a linear axis along which NMR image projection occurs. Thus, the projection direction may be selected by appropriate energization levels of the x and y gradient coil sets. While it is generally preferred that these gradient coil sets be disposed so that the gradient fields are oriented so as to produce gradient fields which lie at right angles with respect to one another, it is not necessary to do so.

Figure 16:
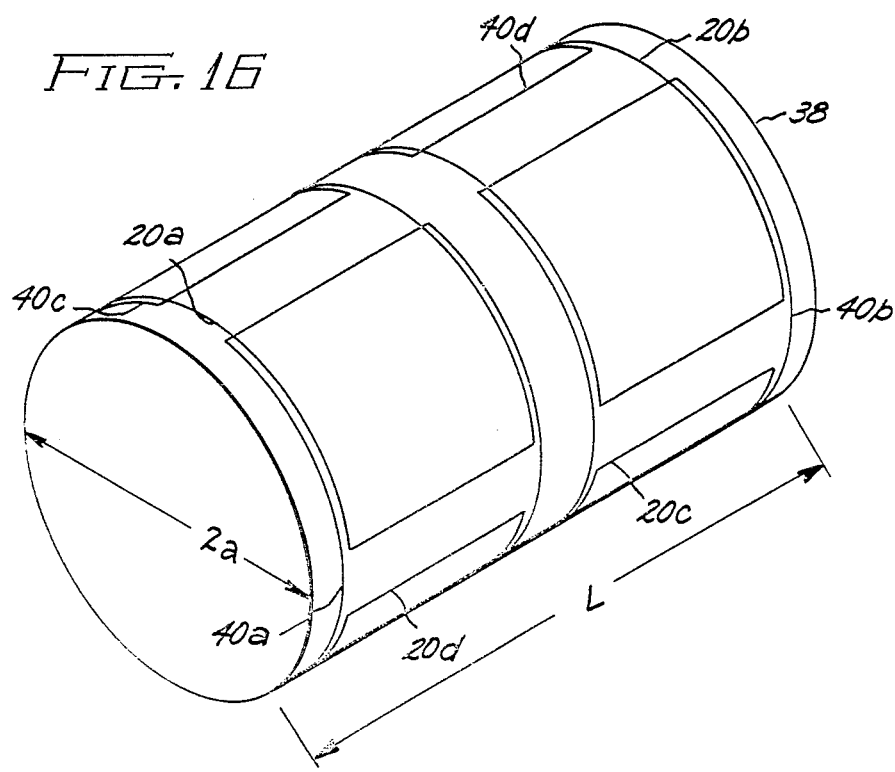
FIG. 16 is an isometric view similar to FIG. 1 except here showing a second set of transverse gradient coils which are rotated 90° with respect to the coils that are shown in FIG. 1.

A schematic diagram of the present invention illustrating a coil form 30 on which both x and y gradient coils are disposed is illustrated in FIG. 16. In particular, symmetrically disposed y-gradient coils 20a, 20b, 20c and 20d may be seen in the view of FIG. 16. Additionally, x-gradient coils 40a, 40b, 40c and 40d may also be at least partially seen in the figure. It is nonetheless understood that, even though FIG. 16 does not illustrate the specific winding patterns employed, FIG. 16 is nonetheless a diagramatical representation of the placement of circuit boards on which the winding patterns may be etched. These patterns may include the patterns shown in FIGS. 10, 11, 17 and 18, all of which illustrate winding patterns for complete or partial sets of x or y gradient coils.

While FIG. 10 illustrates the desired form of the winding patterns and FIG. 11 illustrates the inclusion of return current paths for these winding patterns, FIGS. 17 and 18 represent a more readily implementable set of winding patterns in which spiral current paths are shown. The spiral pattern is essentially formed by means of connections made with the return current paths. These return paths are the upper winding pattern portions shown in FIGS. 17 and 18.

While the winding patterns are particularly describable in terms of functions $\sigma_\phi(z)$ and $\sigma_\phi(z)$ as shown in FIG. 12, it is nonetheless also possible to describe the desired current winding pattern of one of the four patterns for a selected transverse gradient direction to be a sequence of curved arcs concentrically arranged in a rectangular region and having a beginning and ending terminus on an edge of the rectangular region. Additionally, the arcs are somewhat circular in shape, the innermost arcs being most circular with the outermost arcs more closely conforming to the edges of the rectangular region. Additionally, the center of the arcs is located along the midpoint of the edge from which they depart and return. While this description is only an approximation of the exact form of the surface current distribution that is desired, it is nonetheless sufficiently usable as a basis for coil construction to produce gradient fields $B_z$ which exhibit greater linearity and uniformity than the coils described in FIGS. 1 and 2. As in the coil patterns which are shown in FIG. 10, it is also preferable to employ current return paths such as those shown in FIG. 11 and even to configure such current return paths so as to form a continuous spiral pattern as shown in FIGS. 17 and 18.

Moreover, it has been determined by the present inventors that it is possible to employ a winding pattern which is a negative of the pattern shown in FIGS. 17 and 18, for example. That is to say while FIGS. 17 and 18 illustrate a winding pattern which may be fabricated on a printed circuit board by conventional etching methods in which copper is selectively etched away from a circuit board covered with a specific photoresist pattern, it is also possible to reverse this etching process and to etch away conductive material from the printed circuit board so as to leave a pattern in which the insulating printed circuit board shows through in the pattern of FIGS. 17 or 18 for example. It has been found that this negative etching to produce printed circuit board winding patterns nonetheless does not significantly change the magnetic field configuration produced by the coils. It furthermore provides advantages for NMR imaging systems in that the coils formed from these negative printed circuit board images exhibit a lower electrical resistance and accordingly the coils exhibit lower system time constants. This is important in NMR imaging systems in which it is desirable to switch gradient fields rapidly so as to form the desired image in as short a time as possible.

The distributed winding correction coils of the present invention provide improved uniformity of fields produced by such correction coils. Generally speaking the fields from a distributed winding can more closely approach the ideal correction function than can coils made from tightly bunched wires. This is because a distributed winding has more degrees of freedom with respect to where the current paths are located. Also near to the winding, a distributed winding has current everywhere and therefore tends to produce a reasonable approximation to the desired field pattern near to the coil form. Coils using bunched windings with large open areas have large deviations from the desired field pattern close to the coil form. Furthermore, a distributed winding has lower inductance than a winding made from tightly bunched wires since the latter tends to have higher stored magnetic energy in the vicinity of the bunched wires. The examples of transverse linear gradient windings described above represent typical applications for this form of coil design and construction.

One method of manufacturing such a winding is to use a computer-driven milling machine to cut grooves in a thin, flat piece of plastic, place wires into the grooves and apply appropriate adhesives and or potting compounds. The resulting assembly can then be formed to the shape of the cylinder, such as by hammering or the use of a press. Alternatively, the grooved plastic sheet is formed to the cylindrical shape and applied to the cylinder first and then the wires are then laid in the groove and potted. In another alternative, a special two-dimensional milling machine may be employed to cut grooves directly into the cylindrical surface after which the wires are laid into the grooves and the assembly is potted. However, the cutting of grooves, laying and potting of wires and conforming a coil assembly to the cylindrical coil form is a much more difficult and expensive procedure than the etching method proposed in the present invention. There do not appear presently to exist standard milling machines for cutting complex patterns directly onto the surface of a cylinder and such machines would appear to have to be specially developed. However, the present invention obviates the necessity for such construction methods and provides other advantages.

In the present invention a continuous current distribution which generates a desired magnetic field is calculated. A thin line is then etched in a conducting sheet along a streamline of the current distribution. An electrical current path is thereby formed through the remaining material. The current then follows the streamlines in the remaining side bands of conducting material and thus closely approximates the desired current distribution.

In a further embodiment of the present invention several closely spaced streamlines are etched in the conducting sheet so as to form a plurality of parallel, wide, current carrying tracks (conductors). In particular, in the situation in which power is supplied to the coils by means of small inductors which present a substantial impedance at RF frequencies, then the tracks are essentially isolated from each other with respect to radio frequency signals. This is a useful embodiment when the magnetic windings so produced are for example, linear field gradient windings used in NMR imaging systems. Using a number of parallel tracks helps to avoid having the windings present a large expanse of copper which could serve to support any currents that might dampen or otherwise adversely affect other radio frequency fields which are present in such imaging systems.

Several sets of transverse linear gradient coils have been made and assembled in accordance with the present invention. One such set was made as follows. A current streamline pattern was placed onto a plastic sheet with a computer graphics machine. An x pattern and a y pattern were made to fit on the outside of a fiberglass coil form which was approximately 0.67 meters in diameter. The y pattern was made slightly larger so that a fiberglass layer approximately 3 millimeters thick could be placed between the x and y windings. The separations served to reduce the capacitive coupling between the x and y windings. Then negative images were produced where a clear, thin line followed the current streamlines in the above-mentioned x and y patterns and the rest of the plastic was dark. The clear line represented the region to be etched. Using photoresist the negative pattern was transferred to a copper sheet having a thickness of about 0.02 inches and then etched from one side in a spray etching machine. The copper sheet was bonded to a thin plastic backing sheet to prevent relative motion of the parts once the etching was finished. Each sheet took about 20 minutes to etch. The etched sheets thus produced were bonded to a fiberglass coil form using a polyester resin and secured with further layers of fiberglass. A layer approximately 3 millimeters thick was wound onto the outside of the x set of windings and then the y winding set pattern was placed on the coil form. A further layer of about 3 millimeters thickness was then wound on the outside of the y windings to hold them on. The thin lines that were etched correspond to the patterns shown in FIGS. 17 and 18 which may be interpreted herein as either positive or negative (in the photographic sense) winding patterns.

Figure 19:
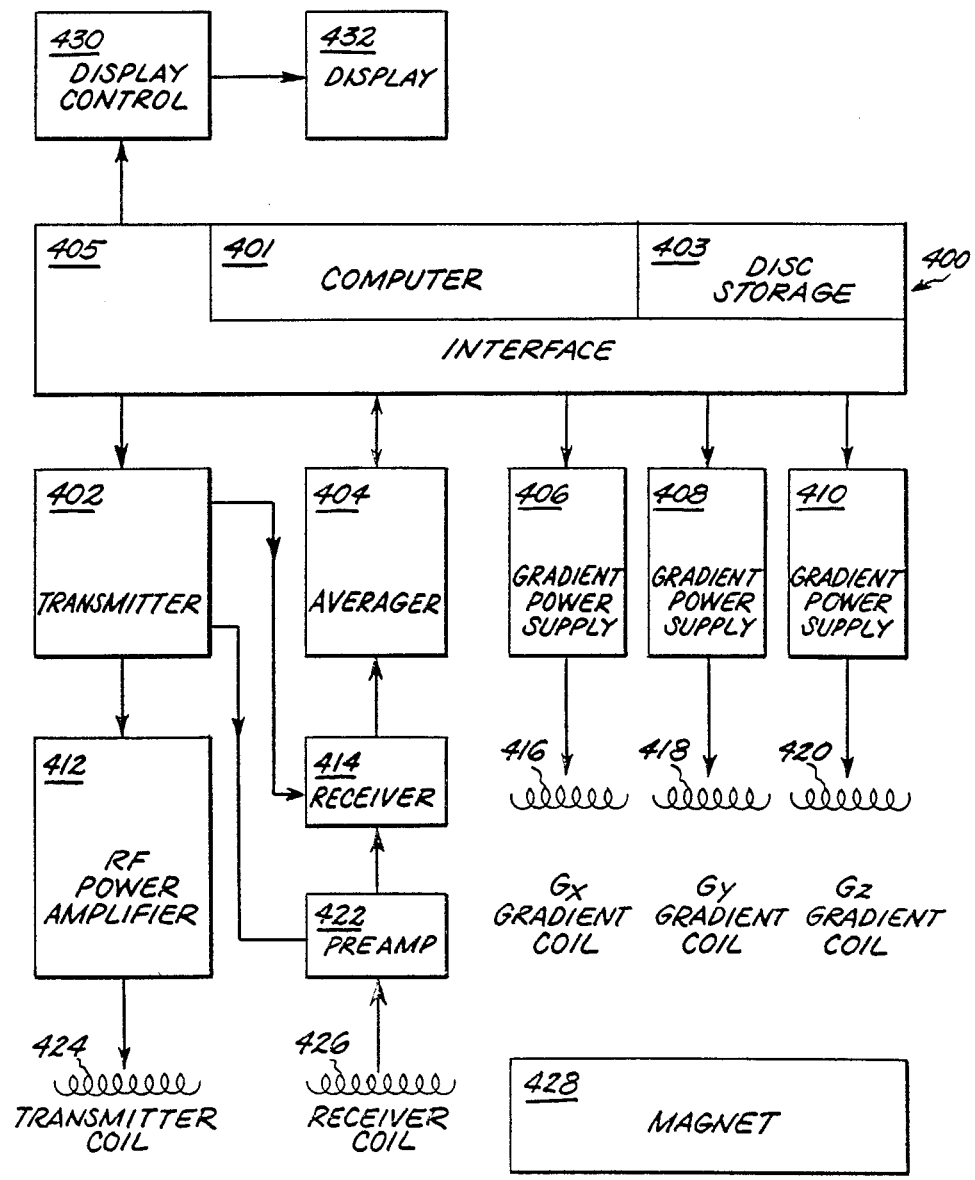
FIG. 19 illustrates components of an NMR imaging system.

As indicated above, the transverse gradient coil of the present invention is particularly suitable for use in an NMR imaging system. FIG. 19 illustrates a simplified block diagram showing the major components of such a nuclear magnetic resonance imaging apparatus suitable for use with the present invention. The overall data handling system, generally designated by reference numeral 400, comprises general purpose computer 401 which is functionally coupled to disc storage unit 403, and to interface unit 405. RF transmitter 402, signal averager 404, and gradient power supplies 406, 408, and 410 are coupled to computer 401 through interface unit 405. The three gradient power supplies are used for energizing, respectively, a set of x, y, and z gradient coils 416, 4lS, and 420. RF transmitter 402 is gated with pulse envelopes from computer 401 to generate RF pulses having the required modulation to excite resonance in the sample being imaged. RF pulses are amplified in an RF power amplifier 412 to levels varying from 100 watts to several kilowatts, depending on the imaging method, and applied to transmitter coil 424. High power levels are necessary for large sample volume such as are encountered in whole body imaging, and where short duration pulses are required to excite large NMR frequency bandwidths. The resulting NMR signal is sensed by receiver coil 426, amplified in low noise preamplifier 422, and thereafter routed to receiver 414 for further amplification, detection, and filtering. This NMR signal may then be digitized and averaged by signal averager 404, and routed to computer 401 for further processing. The process signals are routed from computer 401 through interface 405 to display control unit 430 where they are stored, reformatted, and applied to display unit 432. Display unit 432 may comprise cathode ray tube displays of the direct view storage tube (DVST) types, as well as conventional black and white or color-television-like cathode ray tubes which may include directly viewable calibration traces and the like. Preamplifier 422 and receiver 414 are protected from RF pulses during transmission by active disabling disabling gating and/or by passive filtering. Computer 401 provides gating and envelope modulation for NMR pulses, blanding for preamplifier 422 and RF power amplifier 412, and voltage waveforms for the gradient power supplies. Computer 401 also performs data processing such as Fourier transformation, image reconstruction, data filtering, image display, and storage functions, which are well known in the art and do not form an intrinsic part of the present invention. Transmitter and receiver RF coils may be configured as a single unit. Alternatively, two separate coils that are electrically orthogonal may be used. The latter configuration has the advantage of reduced RF pulse breakthrough into the receiver during pulse transmission. In both cases, the coils are orthogonal to the direction of static magnetic field $B_o$ produced by magnet 428. Coils 426 and 424 are isolated from the remainder of the system by enclosure in an RF shielded cage. Magnetic field gradient coils 416, 418, and 420 are necessary to provide the $G_x$, $G_y$, and $G_z$ magnetic gradient fields, respectively. In particular, the present invention is directed to the formation, utilization and construction of coils 416 and 418. In conventional multiple angle projection reconstruction and spin-wrap reconstruction methods, the gradient fields should be monotonic and linear over the sample volume. These aspects of the gradient fields are thoroughly discussed above. As is known, nonmonotonic gradient fields cause degradations in NMR signal data such as aliasing, which can lead to severe image artifacts. Nonlinear gradient fields $G_x$ and $G_y$ can cause geometric distortions of the image. The transverse gradient coils of the present invention, however, eliminate and/or severely reduce these problems.

From the above, then, it may be appreciated that the present invention provides for the construction, formation and utilization of transverse gradient magnetic field coils which produce magnetic fields exhibiting highly monotonic and highly linear gradients in the transverse direction. It should also be appreciated that the coils of the present invention may be readily manufactured through the employment of printed circuit methods. It should also be appreciated that the coils of the present invention can be constructed in a negative pattern in which the coil windings are found to exhibit significantly reduced levels of resistance. The reduction of the resistance is a significant factor in the NMR imaging use of such coils because the lowered resistance produces a lower time constant which is highly relevant since these coils are typically rapidly switched in a fraction of a millisecond. Accordingly, delays introduced by sluggish system responses are avoided. It is also seen that the present invention eliminates, to a great extent, geometric image distortions. It is also seen that the coil configuration of the present invention also totally eliminates image artifacts due to aliasing. Accordingly, it is seen that the coils of the present invention offer significant advantages in the formation of highly linear gradient magnetic fields and that these coils are particularly valuable in the generation of nuclear magnetic resonance images.

While this invention has been described in detail herein, in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A method for producing an electrical coil for generating magnetic fields said method comprising the steps of:
   calculating a pattern of current paths on a curved three dimensional surface at least partially enclosing a volume, said current paths corresponding to a specified continuous current distribution which is capable of generating a desired magnetic field within said volume, said pattern of current paths being a sequence of arcs on said curved surface;
   providing a continuous conductive layer mounted on an insulative substrate which is conformable to said curved surface;
   removing a thin line of conductive material from said conductive layer on said insulative substrate, said conductive material being removed along said pattern of current paths, the thinness of said line of removed material being measured relative to said remaining conductive material in which conductive current paths in said conductive layer are thereby formed; and
   disposing said conductive layer so as to conform to said curved surface.

2. The method of claim 1 in which said conductive material comprises copper.

3. The method of claim 1 in which said removing step comprises etching of said conductive material.

4. The method of claim 3 in which said etching is performed using a mask produced from a photolithographically negative image of said specified current paths.

5. The method of claim 1 in which said substrate comprises flexible material.

6. The method of claim 1 in which said substrate is cylindrical.

7. The method of claim 1 in which said current distribution is specified for a cylindrical surface in terms of an azimuthal component $\lambda_\phi(\phi,z)$ and a longitudinal component $\lambda_z(\phi,z)$.

8. The method of claim 1 in which said disposing step is performed prior to said removal step.

9. A method for producing electrical coil winding patterns for use in coil structures for producing magnetic fields, said method comprising the steps of:
- calculating a pattern of current paths on a curved three dimensional surface at least partially enclosing a volume, said current paths corresponding to a specified continuous current distribution which is capable of generating a desired magnetic field within said volume, said pattern being a sequence of arcs on said curved surface;
- providing a continuous conductive layer mounted on an insulative substrate which is conformed to said curved surface; and
- removing a thin line of conductive material from said conductive layer mounted on said insulative substrate, said conductive material being removed along said pattern of current paths, the thinness of said line of removed material being measured relative to said remaining conductive material, in which conductive current paths in said conductive layer are thereby formed.

10. A method for producing an electrical coil for generating magnetic fields, said method comprising the steps of:
- calculating a pattern of current paths on a curved three dimensional surface at least partially enclosing a volume, said current paths corresponding to a specified continuous current distribution which is capable of generating a desired magnetic field within said volume, said pattern of current paths being a sequence of arcs on said curved surface;
- providing a continuous conductive layer mounted on an insulative substrate which is generally in the shape of said curved surface; and
- removing a thin line of conductive material from said conductive layer on said insulative substrate, said conductive material being removed along said pattern of current paths, the thinness of said line of removed material being measured relative to said remaining conductive material in which conductive current paths in said conductive layer are thereby formed.

* * * * *